United States Patent [19]
Kaplinsky

[11] Patent Number: 5,424,654
[45] Date of Patent: Jun. 13, 1995

[54] PROGRAMMABLE MACROCELL CIRCUIT

[76] Inventor: Cecil H. Kaplinsky, 140 Melville Ave., Palo Alto, Calif. 94301

[21] Appl. No.: 310,437

[22] Filed: Sep. 22, 1994

[51] Int. Cl.6 .......................................... H03K 19/094
[52] U.S. Cl. ......................................... 326/40; 326/45
[58] Field of Search .................. 326/40, 45, 46, 39; 327/203

[56] References Cited

U.S. PATENT DOCUMENTS

| | | | |
|---|---|---|---|
| 5,001,368 | 3/1991 | Cliff et al. | 326/40 |
| 5,003,204 | 3/1991 | Cushing | 307/465 |
| 5,017,809 | 5/1991 | Turner | 326/45 |
| 5,023,484 | 6/1991 | Pathak | 326/40 |
| 5,148,052 | 9/1992 | Yellamilli | 307/279 |
| 5,164,612 | 11/1992 | Kaplinsky | 307/272.2 |
| 5,295,174 | 3/1994 | Shimizu | 377/76 |

Primary Examiner—David R. Hudspeth
Assistant Examiner—Andrew Sanders
Attorney, Agent, or Firm—Schneck & McHugh

[57] ABSTRACT

A digital logic circuit for use in or as a macrocell which can be programmed to operate as a flip-flop or as a latch, or to be transparent to a signal, and which also has programmable output polarity. This programmable macrocell circuit has two master latch elements and one slave latch element. The master latch elements are respectively inverting and noninverting latches which are located on two parallel alternate paths. A set of pass transistors on the input end of the two paths causes an input signal to drive only a selected one of the two paths and its associated master latch element. A two-by-one multiplexer connects the output of the selected master latch element in one of the two signal paths to the input of the slave latch. The control signals for the set of pass transistors and the two-by-one multiplexer can be either clock signals or fixed logic level signals, the particular choice of signals determining whether the circuit operates as a flip-flop, latch, or transparent circuit, and the particular choice of signal paths determining the circuit's output polarity.

19 Claims, 1 Drawing Sheet ly employed as macrocells, and in
PROGRAMMABLE MACROCELL CIRCUIT

TECHNICAL FIELD

The present invention relates to digital logic circuits of the type commonparticular to such macrocell circuits which can be programmed to operate as a flip-flop or as a latch, or be transparent to a signal, and which also have programmable output polarity.

BACKGROUND ART

In U.S. Pat. No. 164,612, Kaplinsky describes a programmable flip-flop circuit which includes a master inverter latch and a slave inverter latch with a pass transistor connected to the input of the master inverter latch and a special driver circuit connected between the output of the master inverter latch and the input of the slave inverter latch. The pass transistor and driver circuit are responsive to control signals supplied by complementary clock signals $\overline{CLK}$ and CLK or by multiplexers that select either the clock signals or a fixed logic level, to open or close a conductive path to the inputs of the respective master and slave latches. The driver circuit includes first and second transistors connected in series between a first terminal input and the input to the slave inverter latch, as well as third and fourth transistors connected in series between a second terminal input and the input to the slave inverter latch. The gates of the first and third transistors are driven by the output of the master inverter latch, while the gates of the second and fourth transistors are driven by one of the aforementioned control signals. The two terminal inputs connect the first and third transistors either to fixed logic high or low voltage levels or to multiplexers that provide a programmable selection of these voltage levels. In one embodiment, the selection by the multiplexers at these terminal inputs includes a feedback signal from the output of the slave inverter latch, thereby providing a toggle flip-flop programming option. The special driver circuit thus allows the flip-flop circuit to be programmed to operate as a D-type flip-flop, toggle flip-flop, or latch, or even be transparent to a signal and be programmed to provide a selected output polarity.

In U.S. Pat. No. 5,295,174, Shimizu describes a shift register having a plurality (N) of latch circuits which are located on a like plurality of signal paths. An N-by-1 multiplexer, located at the outputs of the plural signal paths, is controlled by a clock so as to select the output of each latch circuit in sequence.

In U.S. Pat. No. 5,148,052, Yellamilli describes a data latching circuit that employs a multiplexer to select either a direct input signal on one signal path or a latched input signal on an alternate signal path for output.

An object of the present invention is to provide a macrocell circuit which can be configured to operate as a flip-flop or as a latch, or which can be transparent to a signal, and which has a programmable output polarity, without sacrificing operational speed, and which is comparatively simple in terms of the number of transistor elements.

DISCLOSURE OF THE INVENTION

The object is met by a programmable macrocell circuit that has two master latch elements located on two, parallel, alternate signal paths, one a non-inverting "true" path and the other an inverting "false" path. Pass gates, located on the input end of each signal path and controlled by a master clock, are provided so that the input signal drives only a selected one of the two alternate signal paths. A 2-by-1 multiplexer is located between the outputs of the two signal paths and the input of a subsequent slave latch element in order to select the signal path to be used, and thereby select the output polarity. Thus, the circuit is characterized by having both true and false, i.e. complementary, signal paths, each with a separate master latch element, and by also having both pass gates for driving only one of the two signal paths and a multiplexer for selecting the output of one of the two paths. The circuit can also be configured so as to drive the pass gates or the multiplexer, or both, with fixed logic levels, instead of a clock signal, in order to provide latch or transparent circuit options.

BEST MODE OF CARRYING OUT THE INVENTION

Figure 1:
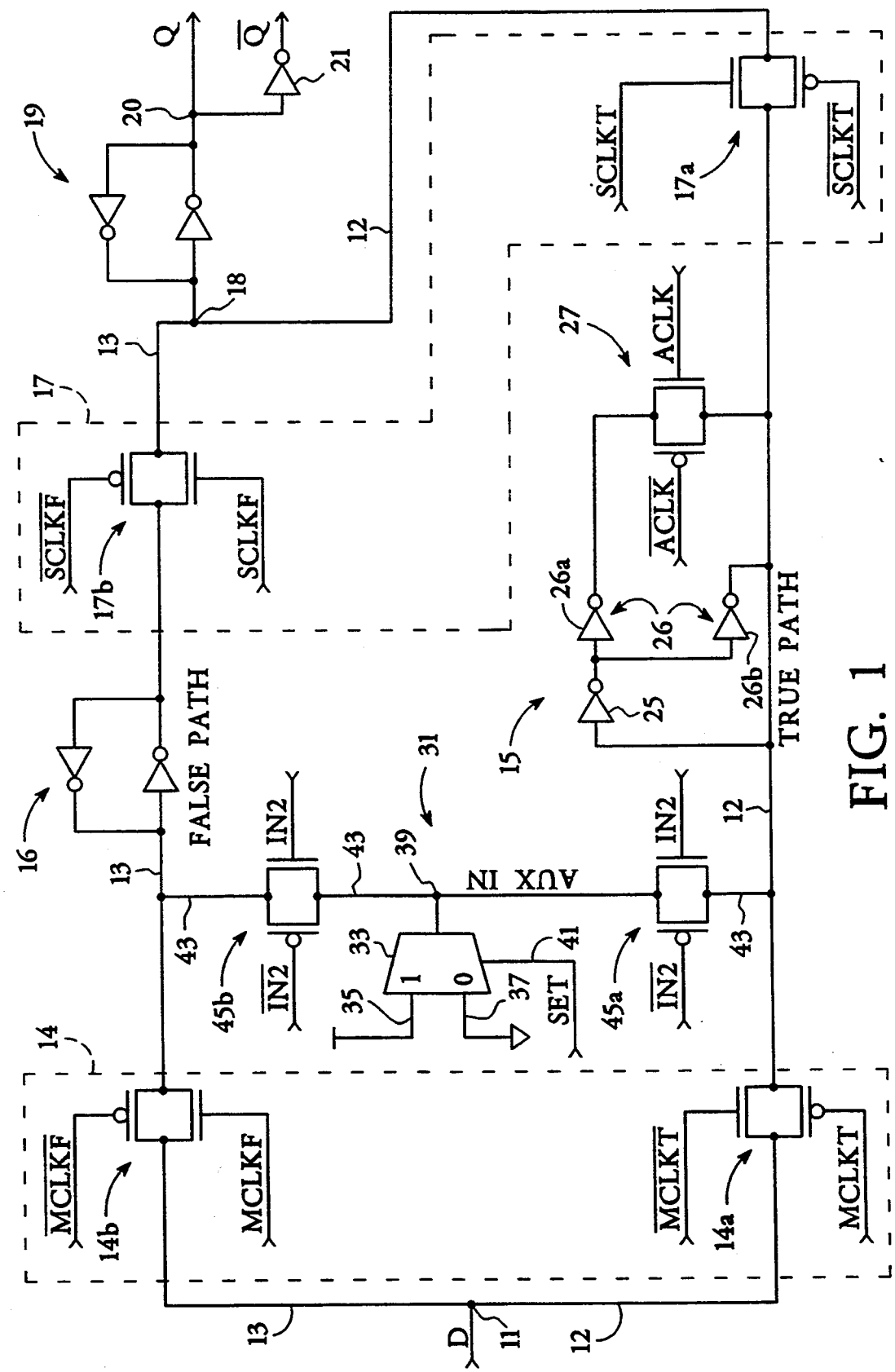
FIG. 1 is a schematic circuit diagram of a programmable macrocell circuit in accord with the present invention.

With reference to FIG. 1, a programmable macrocell circuit of the present invention includes an input terminal 11 receiving an input signal D, a pair of master latch signal paths 12 and 13 branching from the input terminal 11 and designated as a "true" path 12 and a "false" path 13, a pass transistor set 14 on the two signal paths 12 and 13 for selectively driving one and only one of these paths with the received input signal D, a pair of master latch elements 15 and 16, one on each path 12 and 13, a two-by-one clocked multiplexer 17 selecting one latch output for presentation at the input 18 of a single slave latch element 19, and an output terminal 20 at the output of the slave latch element 19. The true and false signal paths 12 and 13 recombine at the slave latch input 18. However, since only one of the two alternate paths 12 and 13 is driven for any particular programmed configuration, no signal conflict between the two paths 12 and 13 will ever occur at the latch input 18.

The pass transistor set 14 and the two-by-one clocked multiplexer 17 are similarly constructed but are placed on the true and false signal paths 12 and 13 on opposite ends of the master latch elements 15 and 16. That is, the pass transistor set 14 is located between the input terminal 11 and the inputs of the two latch elements 15 and 16, and therefore selects which latch element 15 or 16 will be driven by the input signal D, while the multiplexer 17 is located between the outputs of the two master latch elements 15 and 16 and the input 18 of the slave latch 19, and therefore selects which latch element 15 or 16 will drive the slave latch 19. Both the pass transistor set 14 and multiplexer 17 consist of complementary p-channel and n-channel field-effect transistor pairs 14a, 14b, 17a and 17b connected across the true and false signal paths 12 and 13 so that their respective transistor channels form gate-controlled switches for the signal paths. The gates of the complementary transistor pair 14a on the input side of the true path receive a complementary set of signals MCLKT and $\overline{MCLKT}$, the gates of the complementary transistor pair 14b on the input side of the false path receive another complementary set of signals MCLKF and $\overline{MCLKF}$, the gates of the complementary transistor pair 17a on the output side of the true path receive yet another complementary set of signals SCLKT and $\overline{\text{SCLKT}}$, and the gates of the complementary transistor pair 17b on the output side of the false path receive a fourth complementary set of signals SCLKF and $\overline{\text{SCLKF}}$.

When the true path 12 is selected, the signals applied to the transistor pairs 14b and 17b on the false path 13 will be fixed signals that are set to prevent signal transmission through the false path 13. That is, MCLKF=low, $\overline{\text{MCLKF}}$=high, SCLKF=low, and $\overline{\text{SCLKF}}$=high, so that all of the transistors controlled by those signals are off. Likewise, when the false path 13 is selected, the signals applied to the transistor pairs 14a and 17a on the true path 12 will be fixed signals that are set to prevent signal transmission through the true path 12. That is, MCLKT=high, $\overline{\text{MCLKT}}$=low, SCLKT=low, and $\overline{\text{SCLKT}}$=high, so that all of the transistors controlled by those signals are off. This ensures that only the selected signal path 12 or 13 will be driven by the input signal D and in turn drive the input 18 of the slave latch 19. Since the master latch element 15 on the true path 12 does not invert the input signal D, while the master latch element 16 on the false path 14 does invert the input signal D, selection of one or the other signal paths 12 or 13 selects the polarity of the signal applied to the input 18 of the slave latch 19, and hence the polarity at the output 20. The slave latch 19 is typically another inverting latch element, as shown, but could also be a non-inverting latch. The output 20 may also provide both inverted and non-inverted output signals Q and $\overline{\text{Q}}$ via an optional inverter element 21, in which case the polarity selection merely reverses the roles of the two outputs. In a typical macrocell for a logic circuit, one flip-flop output is couplable to an output pin, while the other flip-flop output is coupled to a feedback path to the logic circuitry.

Selection of flip-flop, latch and transparent operation is effected by the signals applied to the transistor pairs on the selected path 12 or 13. The following discussion will use a selected true path 12 as an example. The signals for a selected false path are analogous. For flip-flop operation, both the signals MCLKT and $\overline{\text{MCLKT}}$ applied to the transistor pair 14a and the signals SCLKT and $\overline{\text{SCLKT}}$ applied to the transistor pair 17a are clock signals, where the master and slave clock signals are synchronous and complementary. That is, MCLKT=CLK, $\overline{\text{MCLKT}}$=$\overline{\text{CLK}}$, SCLKT=CLK, and $\overline{\text{SCLKT}}$=$\overline{\text{CLK}}$, where CLK is any arbitrary clock signal. For latch operation, only the master signals MCLKT and $\overline{\text{MCLKT}}$ applied to the pass transistor pair 14a, or alternatively, only the slave signals SCLKT and $\overline{\text{SCLKT}}$ applied to the multiplexer transistor pair 17a, are clock signals, the other set of master or slave signals being fixed to allow continuous transmission through the corresponding transistor elements. That is MCLKT=CLK, $\overline{\text{MCLKT}}$=$\overline{\text{CLK}}$, SCLKT= high, and $\overline{\text{SCLKT}}$=low, or alternatively, MCLKT=low, $\overline{\text{MCLKT}}$=high, SCLKT=CLK and $\overline{\text{SCLKT}}$=$\overline{\text{CLK}}$. Finally, for transparent operation, all of the signals for the selected path are fixed for continuous signal transmission, i.e. conductance of the transistor pairs. That is, MCLKT=low, $\overline{\text{MCLKT}}$=high, SCLKT=high, and $\overline{\text{SCLKT}}$=low. All of the transistor control signals may be received from multiplexers, not shown, that programmably select either clock inputs (CLK or $\overline{\text{CLK}}$) or fixed signal inputs (high and low) by means of configuration memory bits, such as EPROMs or EEPROMs. For full programmability, each transistor pair 14a, 14b, 17a, and 17b receives its respective signals independently from the others and so has its own selection multiplexer.

Referring now to the various latch elements 15, 16 and 19 in the circuit, the master latch element 16 on the false path 13 and the slave latch 19 are normally inverter latches consisting of pairs of CMOS inverters that are cross-coupled such that the output of one inverter is connected to the input of the other. Both of these latch elements, therefore, invert the signals received at their respective inputs and provide the inverted signals at their respective outputs. The master latch element 15 on the true path 12 consists generally of a pair of CMOS inverters 25 and 26 coupled in series, with the output of the second inverter 26 coupled back to the input of the first inverter 25 along the true path 12. However, because it is preferable to inhibit the latch element's feedback path from coming in when operating in a latched mode, so that the latch element 15 effectively becomes transparent to the signal and doesn't slow down signal propagation, the second inverter 26 is normally made up of two inverter elements 26a and 26b of different strengths, both connected at their respective inputs to the output of the first inverter 25. The stronger inverter element 26a is only indirectly coupled to the true path 12 via a pass transistor pair 27 whose gates are controlled by complementary signals ACLK and $\overline{\text{ACLK}}$, while the weaker inverter element 26b is directly coupled to the true path 12. The pass transistor pair 14a is not strong enough to rapidly switch the state of the strong inverter element 26a. Accordingly, the transistor pair 27 is shut, isolating the strong inverter element 26a, prior to the pass transistor pair's 14a opening so as to drive only the inverter elements 25 and 26b with the input signal D transmitted through the transistor pair 14a along the true signal path 12. Once the pass transistor pair 14a is closed, isolating the master latch element 15 from the input signal D, the transistor 27 opens to reconnect the strong inverter element 26a to the latch element's feedback path along path 12. To satisfy this requirement, the control signal ACLK is essentially the same as the signal MCLKT, but precedes MCLKT by about 150 psec to 200 psec. Likewise, $\overline{\text{ACLK}}$ precedes $\overline{\text{MCLKT}}$ by the same time interval. This phase difference can be readily achieved with a simple gate delay element through which the signals MCLKT and $\overline{\text{MCLKT}}$ must pass in order to reach the gates of transistors 14a.

The macrocell circuit in FIG. 1 is also provided with a set/reset circuit 31 for preloading a specified logic value into the master latch elements 15 and 16. A multiplexer 33 received two inputs 35 and 37, one at a logic high (or "1") level and the other at a logic low (or "0") level, and provides an output signal AUX IN on an output 39. The value of the output signal AUX IN is selected by the multiplexer 33 from either the logic high level on input 35 or the logic low level on input 37, in response to a selection signal SET on a control input 41. The output signal AUX IN at output 39 is transmitted to the true and false paths 12 and 13 on the input side of the master latch elements 15 and 16 via an auxiliary input path 43 through two pairs of pass transistors 45a and 45b. The complementary transistors in each pair 45a and 45b receive asynchronous signals IN2 and $\overline{\text{IN2}}$ at their gates, which either allow the signal AUX IN to be loaded into the master latch elements 15 and 16 or block transmission of the AUX IN signal to the latch elements 15 and 16. In the normal mode, IN2 is low and $\overline{\text{IN2}}$ is high, and the data signal D at the input 11 is passed through pass transistor 14 to one of the master latch elements 15 or 16. In the set mode, IN2 is high and IN2 is low, and both pass transistor pairs 14a and 14b are closed, allowing the selected high or low value AUX IN to be loaded into the master latch elements 15 and 16. Since the macrocell circuit in FIG. 1 is often a part of a larger logic circuit in which the input signal D is derived from programmable logic, the set circuitry 31 allows a user to bypass such programmable logic and directly input a value into the macrocell circuit's latch elements.

I claim:

1. A programmable macrocell circuit comprising
   a first master latch element located in a first signal path, said first master latch element being a noninverting latch,
   a second master latch element located on a second signal path, said second master latch element being an inverting latch,
   a set of pass transistors located on each of said first and second signal paths, said pass transistors being connected between a common input terminal for both signal paths and respective inputs of said first and second master latch elements, said set of pass transistors being responsive to a first set of control signals to pass an input signal on said common input terminal to said input of only a selected one of said master latch elements,
   a slave latch having an input and an output, and
   a two-input, one-output multiplexer connected between outputs of said first and second master latch elements and said input of said slave latch, said multiplexer being responsive to a second set of control signals to pass an output signal from said output of only a selected one of said master latch elements to said input of said slave latch.

2. The circuit of claim 1 wherein said first master latch element includes a first inverter with an input connected to said first signal path, and second and third inverters both with inputs connected to an output of said first inverter, said second inverter having an output connected directly to said first signal path, said third inverter having an output coupled to said first signal path through a pass transistor, said pass transistor responsive to a control signal such that said pass transistor isolates said third inverter from said first signal path whenever said first master latch element is coupled through said set of pass transistors on said first signal path to said common input terminal.

3. The circuit of claim 1 wherein said second master latch element comprises a pair of cross-coupled inverters.

4. The circuit of claim 1 wherein said first set of control signals for said set of pass transistors and said second set of control signals for said multiplexer being fixed logic level signals for one of said first and second signal paths for blocking transmission along that one signal path and being selected from fixed logic level signals and clock signals for the other of said first and second signal paths for allowing controlled transmission along that other signal path.

5. The circuit of claim 4 wherein said selected control signals for said other signal path are complementary clock signals applied to said set of pass transistors in said other signal path and to said multiplexer.

6. The circuit of claim 4 wherein said selected control signals for said other signal path are a clock signal applied to one and a fixed logic level signal applied to the other of said set of pass transistors and said multiplexer.

7. The circuit of claim 4 wherein said selected control signals for said other signal path are fixed logic level signals applied to both said set of pass transistors on said other signal path and to said multiplexer.

8. The circuit of claim 1 further comprising means connected to said first and second signal paths between said set of pass transistors and said first and second master latch elements for loading a set logic value into said master latch elements independently of said common input terminal.

9. A programmable macrocell circuit comprising
   an input terminal for receiving an input signal,
   a first pass gate having an input connected to said input terminal, an output, and a control terminal responsive to a first control signal to selectively pass or block transmission of said input signal to said output of said first pass gate,
   a second pass gate having an input connected to said input terminal, an output, and a control terminal responsive to a second control signal to selectively pass or block transmission of said input signal to said output of said second pass gate,
   a first master latch element having an input connected to said output of said first pass gate and having an output, said first master latch element being a noninverting latch providing a first stored signal,
   a second master latch element having an input connected to said output of said second pass gate and having an output, said second master latch element being an inverting latch providing a second stored signal,
   a third pass gate having an input connected to said output of said first master latch element, an output, and a control terminal responsive to a third control signal to selectively pass or block transmission of said first stored signal to said output of said third pass gate,
   a fourth pass gate having an input connected to said output of said second master latch element, an output, and a control terminal responsive to a fourth control signal to selectively pass or block transmission of said second stored signal to said output of said fourth pass gate, and
   a slave latch element having an input connected to said outputs of said third and fourth pass gates and having an output providing an output signal of said circuit.

10. The circuit of claim 9 wherein said first master latch element comprises first, second and third inverters and a fifth pass gate, with inputs of said second and third inverters both connected to an output of said first inverter, with an output of said third inverter connected to an input of said fifth pass gate, and with an input of said first inverter, an output of said second inverter and an output of said fifth pass gate connected together to each other and to both said output of said first pass gate and said input of said third pass gate, said fifth pass gate also having a control terminal responsive to a fifth control signal to selectively isolate said output of said third inverter whenever said first pass gate is transmitting said input signal.

11. The circuit of claim 9 further comprising means connected to said inputs of said first and second master latch elements for loading a set logic value signal into said master latch elements independently of said input terminal.

12. The circuit of claim 9 wherein said first and third control signals are fixed logic level signals blocking transmission through said first and third pass gates.

13. The circuit of claim 12 wherein said second and fourth control signals are complementary clock signals.

14. The circuit ore claim 12 wherein one of said second and fourth control signals is a fixed logic level signal allowing transmission through the corresponding pass gate and the other of said second and fourth control signals is a clock signal.

15. The circuit of claim 12 wherein both of said second and fourth control signals are fixed logic level signals allowing transmission through said second and fourth pass gates.

16. The circuit of claim 9 wherein said second and fourth control signals are fixed logic level signals blocking transmission through said second and fourth pass gates.

17. The circuit of claim 16 wherein said first and third control signals are complementary clock signals.

18. The circuit of claim 16 wherein one of said first and third control signals is a fixed logic level signal allowing transmission through the corresponding pass gate and the other of said first and third control signals is a clock signal.

19. The circuit of claim 16 wherein both of said first and third control signals are fixed logic level signals allowing transmission through said first and third pass gates.

* * * * *